United States Patent [19]

Funk et al.

[11] 4,278,348

[45] Jul. 14, 1981

[54] LOCKING MECHANISM FOR USE IN A CHUCK FOR AN OPTICAL ALIGNMENT AND EXPOSURE APPARATUS

[75] Inventors: Ernest J. Funk, Cupertino; Thomas Wing, Woodland Hills; Jack C. Lane; Edward S. Westbrook, IV, both of Saratoga, all of Calif.

[73] Assignee: Quintel Corporation, San Jose, Calif.

[21] Appl. No.: 97,331

[22] Filed: Nov. 26, 1979

[51] Int. Cl.³ .............................................. G03B 27/60
[52] U.S. Cl. ........................................ 355/73; 269/21; 269/310; 279/3; 355/79
[58] Field of Search .................... 269/59, 74, 321 WE, 269/21, 310; 355/79, 73; 279/1 L, 4, 16, 3

[56] References Cited

U.S. PATENT DOCUMENTS

| 3,674,368 | 7/1972 | Johannsmeier | 355/78 |
| 3,705,769 | 12/1972 | Johannsmeier | 355/78 X |
| 3,833,230 | 9/1974 | Noll | 269/21 X |
| 3,853,313 | 12/1974 | Appenzeller et al. | 269/21 |
| 3,858,978 | 1/1975 | Johannsmeier | 355/79 |

FOREIGN PATENT DOCUMENTS 1175167  7/1964  Fed. Rep. of Germany ............. 269/21

*Primary Examiner*—Richard A. Wintercorn
*Attorney, Agent, or Firm*—Patrick J. Barrett

[57] ABSTRACT

A locking device for use in the chuck of an optical alignment and exposure apparatus is disclosed. The locking device comprises a plurality of flat, flexible blades fastened in pairs to a chuck plate in the chuck. Between each pair of blades there is a stationary element fastened to a base member in the chuck. Vacuum cups are fastened to the blades so that the blades are clamped tightly against the stationary element when the vacuum cups are evacuated.

19 Claims, 8 Drawing Figures

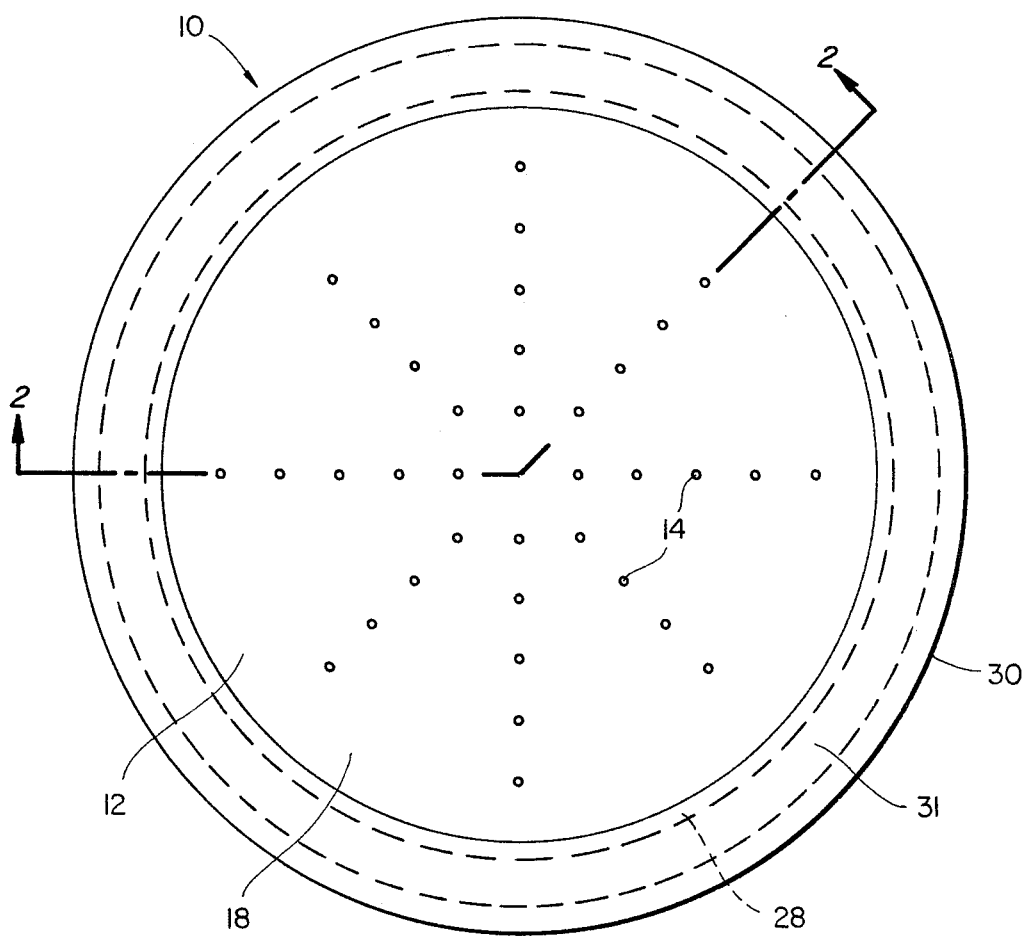
FIG_1
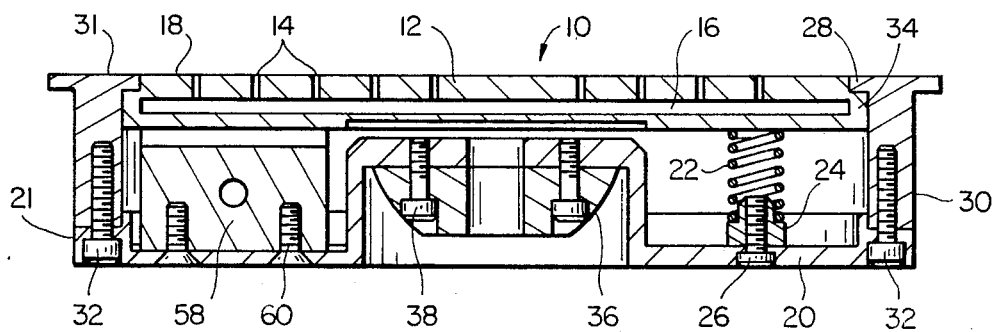
FIG_2

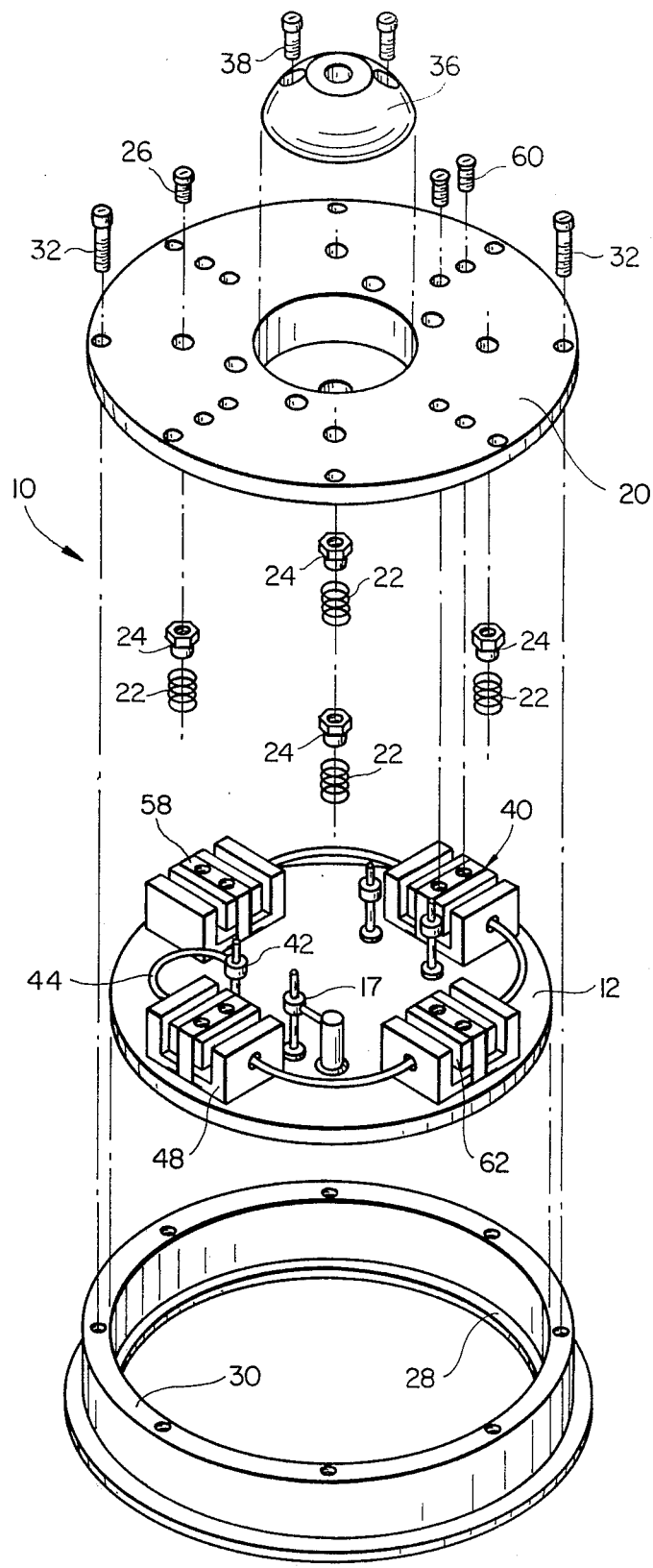
FIG_3

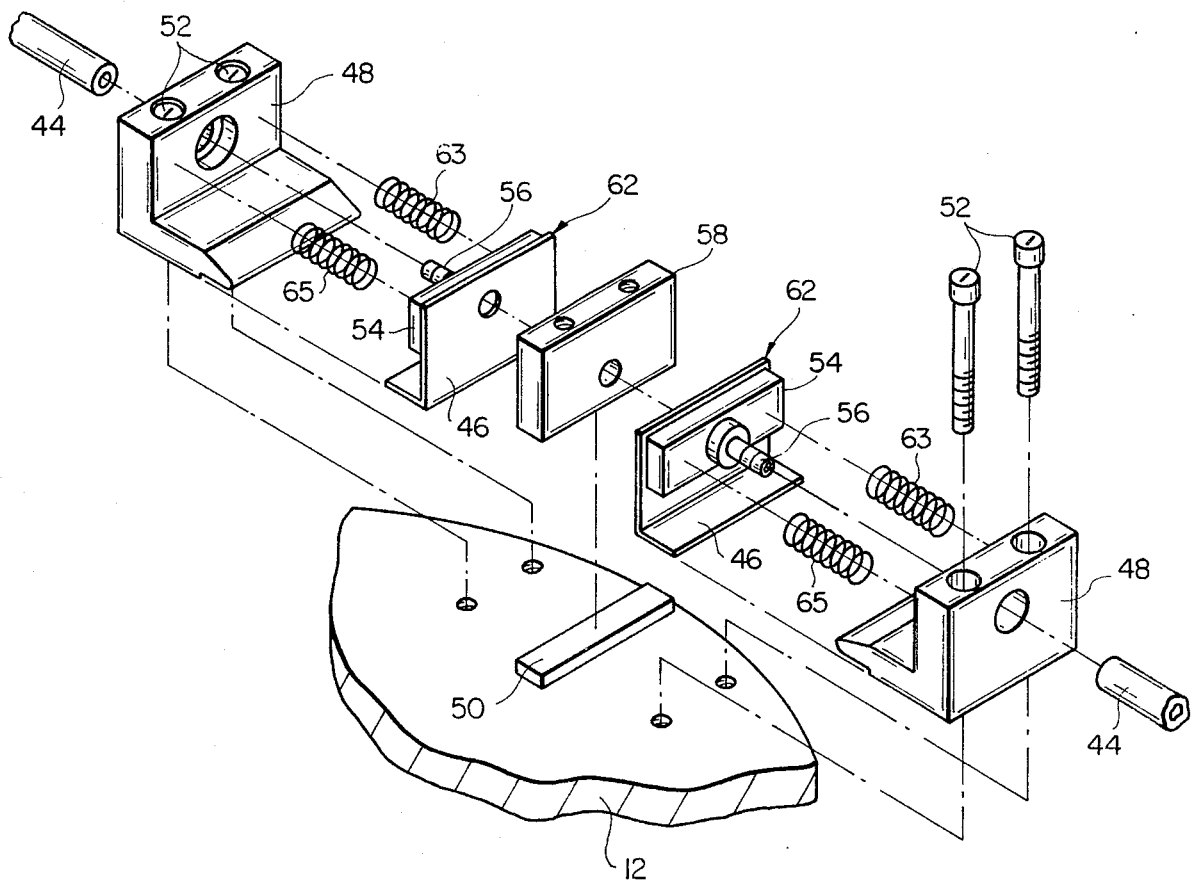
FIG_4
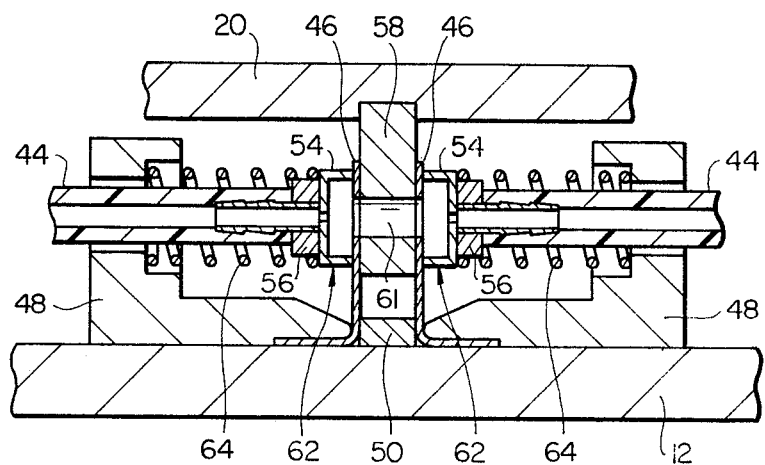
FIG_5

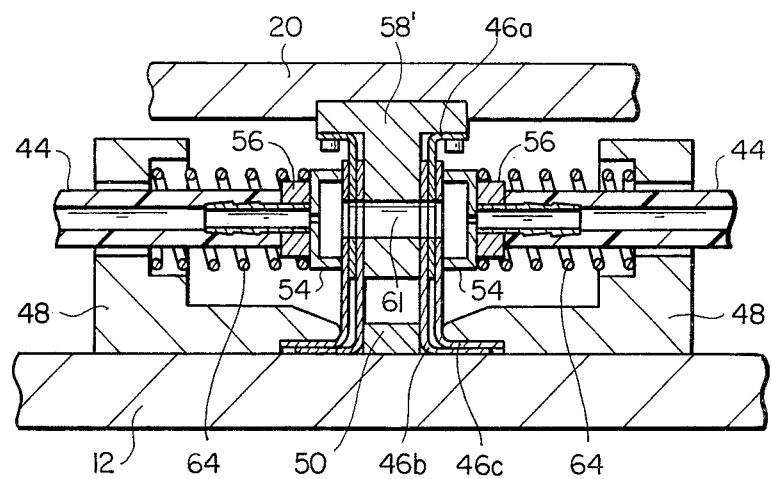
FIG_6
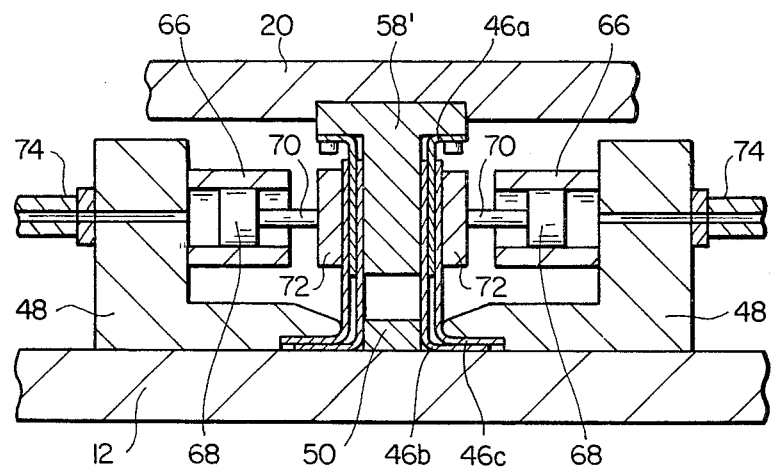
FIG_7
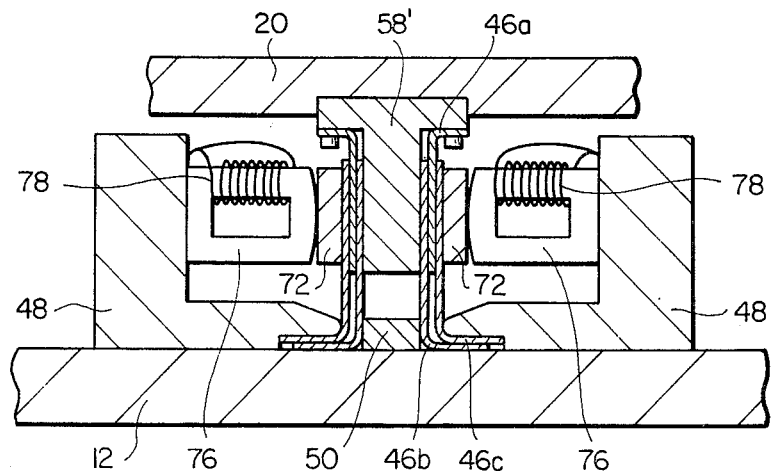
FIG_8

LOCKING MECHANISM FOR USE IN A CHUCK FOR AN OPTICAL ALIGNMENT AND EXPOSURE APPARATUS

BACKGROUND OF THE INVENTION

This invention relates generally to apparatus for aligning a semiconductive wafer with a photomask and exposing a photosensitive film on a surface of the wafer through the photomask. It relates, more particularly, to an improved chuck for holding the wafer parallel to, but out of contact with, the photomask while the wafer is being aligned with and, in some apparatus, while it is being exposed through the mask.

Many prior art devices are available for aligning a semiconductive wafer with a photomask, and a number of such devices are described in U.S. Pat. No. 3,858,978 issued Jan. 7, 1975 to Karl-Heinz Johannsmeier. As explained more fully in that patent, it is desirable to maintain the photomask and semiconductive wafer parallel, but separated, during the alignment and exposure steps. For that reason, out-of-contact or proximity chucks such as the one described in the aforementioned patent have been developed.

A proximity chuck must perform several functions in addition to holding the semiconductive wafer to its top surface. The chuck must be depressible below a reference surface, and some mechanism must be provided to hold the chuck in position without slippage. In addition, the holding mechanism must not impart any movement to the chuck while the chuck is being held in position. It is also desirable for the chuck to be able to move about axes in the horizontal plane. This angular movement compensates for wafers that are slightly warped or wedge-shaped. However, in addition to holding or maintaining the vertical position of the chuck, the holding mechanism must also be able to hold the angular position of the chuck.

As is more fully described in the referenced prior patent, a commonly used prior art holding mechanism was a plastic or metal spring that frictionally held a chuck plate within a base member. It has been discovered, however, that this type of holding mechanism has a number of disadvantages. After a period of use the spring and the mating surface on the base member will wear, reducing the amount of frictional holding force and allowing undesirable slippage. In these prior art devices, very close tolerances in dimensions and material quality must be maintained to produce a consistent holding force. In addition, wear patterns such as grooves or slight depressions formed on the mating surface can cause the spring to hold the chuck plate at the same position each time it is depressed, even when a slightly different position is required. Furthermore, the prior art proximity chucks did not hold the chuck plate from angular movement about axes perpendicular to the direction of displacement of the chuck.

Another type of holding mechanism that has been proposed uses spring clutches attached to a chuck plate. Each spring clutch surrounds a post on a base member, and an actuating mechanism is attached to the free end of the spring. To hold the position of the chuck plate, the actuating mechanism pulls on the free end of the spring to tighten it around the post. This type of holding mechanism, however, has the significant disadvantage that it usually imparts some undesirable movement to the chuck plate during the tightening of the spring.

SUMMARY OF THE INVENTION

In accordance with the preferred embodiment of the present invention, a locking mechanism is provided for a semiconductive wafer chuck for use in an optical alignment and exposure apparatus. The locking mechanism has a number of sets of flexible blades that are attached to a chuck plate in the chuck. Between each pair of blade sets there is a stationary element attached to a base member. A vacuum cup is attached to the outermost blade of each blade set, and a hole through each set of blades and the corresponding stationary element connects the vacuum cups for each set of blades.

When air is evacuated from the vacuum cups, atmospheric pressure presses the blades tightly against the stationary elements, preventing any movement of the chuck plate with respect to the base member. When the vacuum cups are not evacuated, the stationary elements can slide freely between the blades in the vertical direction to allow the chuck plate to be depressed or returned to its up position. Some angular movement of the chuck plate is also permitted by the blades because they can flex with respect to the chuck plate.

This locking mechanism overcomes the disadvantages of prior art devices by locking the position of the chuck plate without slippage and without imparting any undesirable movement to the chuck plate. Also, this locking mechanism will not create wear patterns that will cause it to lock in the same position after a period of use and the dimensional and material tolerances are must less critical than those in the prior art devices. In addition, because of the flexible blades this locking mechanism provides for some anuglar movement of the chuck plate and locks both its vertical position and its angular position. The locking mechanism can be used not only in proximity chucks, but also in chucks for use in contact print mask aligners and in projection mask aligners.

BRIEF DESCRIPTION OF THE DRAWING

FIG. 1 shows a top view of a chuck in accordance with the preferred embodiment of the present invention.

FIG. 2 shows a cross-sectional view of the device of FIG. 1.

FIG. 3 shows an exploded view of the device of FIG. 1.

FIG. 4 shows an exploded view of a locking device in accordance with the preferred embodiment of the present invention.

FIG. 5 shows a sectional view of the device of FIG. 4.

FIG. 6 shows a sectional view of an alternate embodiment of the device of FIG. 4.

FIGS. 7 and 8 show sectional views of alternative embodiments of the device of FIG. 6.

DETAILED DESCRIPTION OF THE PREFERRED EMBODIMENT

FIGS. 1, 2 and 3 show a chuck 10 for use in an optical alignment and exposure apparatus. A chuck plate 12 has a plurality of orifices 14 leading to a passage way 16. Passage way 16 is coupled to a vacuum pump (not shown) by a standard vacuum connector 17 and vacuum lines (not shown) such as are disclosed in referenced U.S. Pat. No. 3,858,978. A work piece in the form of a semiconductive wafer (not shown) can be held down to the top surface 18 of the chuck plate 12 by the vacuum.

Chuck plate 12 is supported on a base plate 20 by a plurality of springs 22. Each spring 22 is seated on a retainer 24 which is secured to base plate 20 by a screw 26. The vertical travel in the upward direction is limited by a lip 28 on a reference ring 30 attached to base plate 20 by screws 32 to form a base member 21. Lip 28 engages a lip 34 on chuck plate 12 and reference ring 30 has a reference surface 31 for calibration purposes. A spherical sector 36 is attached to base plate 20 by screws 38, and chuck 10 is supported in the optical alignment and exposure apparatus by spherical sector 36 as is disclosed in referenced U.S. Pat. No. 3,858,978. It will be understood that, while springs 22 have been shown as supports for chuck plate 12, other support means such as air-filled bellows could be used.

As can be seen from FIG. 3, chuck 10 includes four locking devices 40 that comprise the locking mechanism. The locking devices 40 are connected to a vacuum connector 42 by a vacuum line 44. It will be understood that fewer or more locking devices could be used depending upon the amount of space available and the amount of locking force required.

A locking device 40 is shown in greater detail in FIGS. 4 and 5. Blades 46 are secured against chuck plate 12 by clamps 48 and retainer block 50, and clamps 48 are fastened to chuck plate 12 by screws 52. Each blade 46 has a vacuum coupling 56 and vacuum line 44. Between each pair of blades 46 there is a brake or stationary element 58 that is attached to base plate 20 by screws 60. A hole 61 through the stationary element and each blade connects the two vacuum cups in the illustrated embodiment so that all of the locking devices can be connected in series to the vacuum pump. It should be noted, however, that hole 61 is not necessary and each vacuum cup could be connected in parallel to the vacuum pump.

The blade and vacuum cup combination forms a brake shoe 62 that is held lightly against stationary element 58 by a pair of springs 63 and 65. The force exerted by springs 63 and 65 is sufficient to keep the brake shoes in contact with the stationary elements, but not so large as to retard significantly the vertical movement of chuck plate 12 due to the force applied by springs 22. Vacuum cups 54 may either be attached to blades 24, such as by cement, or they may simply be held against blades 46 by springs 63 and 65. As shown in FIG. 5, a single spring 64 may be used in place of springs 63 and 65, although the use of two springs permits greater angular movement of chuck plate 12 and compensates better for any misalignment between stationary element 58 and blades 46.

Chuck plate 12 can be freely moved in the vertical direction with respect to base member 21 so long as the air inside of vacuum cups 54 is at atmospheric pressure since the blades and the stationary element will slide with respect to each other. Angular movement of the chuck plate with respect to the base member is also possible because each pair of blades is clamped such that the blades are free to flex near the clamping point while remaining parallel to each other and in contact with stationary elements 58. When the air in vacuum cups 54 is evacuated then brake shoes 62 are clamped against stationary elements 58 with a force equal to the cross-sectional interior area of the vacuum cup times the difference between atmospheric pressure and the air pressure in the vacuum cup. The braking force that resists springs 22 is the clamping force times the coefficient of friction between the brake shoe and the stationary element.

In the preferred embodiment, stationary element 58 is made of hardened steel ground to a smooth finish of R.M.S. 16. Blades 46 are made from 0.0015 inches (0.038 mm) thick type 303 stainless steel shim stock that also has a hard, smooth surface. Brass and carbon steel blades have also been used successfully. Starting with materials that have hard, smooth mating surfaces makes the locking characteristics of the locking device more repeatable and reliable over long periods of use since wear due to the movement of the parts will only continue to polish the braking surfaces.

Since the locking device has flat surfaces that are clamped together to lock the position of the chuck plate, undesirable wear patterns such as were encountered with the prior art cannot develop in this device. In addition, undesirable motion is not imparted to the chuck plate when the locking device is actuated since the movement of the brake shoes is perpendicular to the direction of movement of the chuck plate with respect to the base member.

If additional braking force is desired, additional blades can be used as shown in FIG. 6. There a blade 46a is clamped to stationary element 58' and has blades 46b and 46c on either side of it. Vacuum cup 54 is attached to blade 46c. When air is evacuated from the vacuum cups, three times the braking force of the device of FIG. 5 is applied by the device of FIG. 6 due to the threefold increase in braking surface. The flexibility of the blades in this embodiment also provides for angular movement of the chuck plate when the locking device is not locked.

FIG. 7 shows an alternate force applying means for pressing blades 46a, b and c against stationary element 58. An air cylinder 66 is attached to each clamp 48, and there is a piston 68 in each air cylinder 66. Each piston 68 is attached to a rod 70 coupled to a brake block 72. When pressurized air is supplied to the air cylinders through air lines 74, the pistons acting through the brake blocks force the blades against the stationary element and lock the position of chuck plate 12 with respect to base plate 20.

FIG. 8 shows still another force applying means for pressing the blades against the stationary element. A magnetostrictive element 76 is supported between each clamp 48 and brake block 72. A coil 78 is wound around each magnetostrictive element. When an electric current is passed through coils 78, the magnetostrictive elements expand and force the blades against the stationary element.

We claim:

1. In a chuck for use in an optical alignment and exposure apparatus having a chuck plate supported in a base member and means for urging the chuck plate away from the base member, a locking mechanism for maintaining a fixed relationship between the chuck plate and the base member comprising:
   flexible blade means fastened to one of the chuck plate and base member;
   a brake element fastened to the other of the chuck plate and base member, and having a surface slidably in contact with a surface of the flexible blade means; and
   force applying means for urging the contacting surfaces of flexible blade means and the brake element together with sufficient force to prevent the flexible blade means and the brake element from sliding with respect to each other and to maintain a fixed separation between the chuck plate and the base member in response to an input stimulus.

2. A locking mechanism as in claim 1 wherein the brake element is a block of material having two flat, parallel surfaces and the flexible blade means comprises two flat blades, each flat blade being held slidably in contact with one of the flat parallel surfaces of the brake element.

3. A locking mechanism as in claim 2 wherein the force applying means comprises cup means on each flat blade and means for evacuating the air from the cup means.

4. A locking mechanism as in claim 2 wherein the force applying means comprises a fluid actuated piston in a cylinder.

5. A locking mechanism as in claim 2 wherein the force applying means comprises an electromagnetically actuated magnetostrictive element.

6. A locking mechanism as in claim 1 wherein the brake element is a block of material having two flat, parallel surfaces and the flexible blade means comprises two interleaved sets of blades, each set of interleaved blades being held in contact with one of the flat, parallel surfaces of the brake element.

7. A locking mechanism as in claim 6 wherein the force applying means comprises cup means on the outermost blade of each set of blades and means for evacuating the air from the cup means.

8. A locking mechanism as in claim 6 wherein the force applying means comprises a fluid actuated piston in a cylinder.

9. A locking mechanism as in claim 6 wherein the force applying means comprises an electromagnetically actuated magneostrictive element.

10. A chuck for use in an optical alignment and exposure apparatus comprising:
   a chuck plate having an upper surface and a lower surface;
   a base member having an upper surface, a lower surface and a reference surface;
   chuck support means fastened to the lower surface of the base member for supporting the chuck in the apparatus;
   first force applying means for urging the chuck plate away from the upper surface of the base member;
   a brake element fastened to one of the lower surface of the chuck plate and the upper surface of the base member and having a braking surface;
   flexible blade means fastened to the other of the lower surface of the chuck plate and the upper surface of the base member and having a braking surface slidably in contact with the braking surface of the brake element; and
   second force applying means for urging the braking surface of the flexible blade means against the braking surface of the brake element in response to an input stimulus to prevent the flexible blade means and the brake element from sliding with respect to each other and to maintain a fixed spatial relationship between the upper surface of the chuck plate and the reference surface.

11. A chuck as in claim 10 wherein the brake element is a block of material having two flat, parallel braking surfaces and the flexible blade means comprises two flat blades, each flat blade being held in contact with one of the flat, parallel braking surfaces of the brake element.

12. A chuck as in claim 10 wherein the second force applying means comprises cup means on each flat blade and means for evacuating the air from the cup means.

13. A chuck as in claim 10 wherein the second force applying means comprises a fluid actuated piston in a cylinder.

14. A chuck as in claim 10 wherein the second force applying means comprises an electromagnetically actuated magnetostrictive element.

15. A chuck as in claim 10 wherein the brake element is a block of material having two flat, parallel surfaces and the flexible blade means comprises two interleaved sets of blades, each set of interleaved blades being held in contact with one of the flat, parallel surfaces of the brake element.

16. A chuck as in claim 15 wherein the second force applying means comprises cup means on the outermost blade of each set of blades and means for evacuating the air from the cup means.

17. A chuck as in claim 15 wherein the second force applying means comprises a fluid actuated piston in a cylinder.

18. A chuck as in claim 15 wherein the second force applying means comprises an electromagnetically actuated magnetostrictive element.

19. A chuck as in claim 10 wherein there is a plurality of brake members and corresponding flexible blade means.

* * * * *